United States Patent
Dai

(10) Patent No.: US 6,612,850 B2
(45) Date of Patent: *Sep. 2, 2003

(54) SLOT PINHOLE DUAL LAYOUT ON A CIRCUIT BOARD

(75) Inventor: Ming-Hou Dai, Taoyuan (TW)

(73) Assignee: Asustek Computer Inc., Taipei (TW)

( * ) Notice: Subject to any disclaimer, the term of this patent is extended or adjusted under 35 U.S.C. 154(b) by 58 days.

This patent is subject to a terminal disclaimer.

(21) Appl. No.: 09/852,004

(22) Filed: May 10, 2001

(65) Prior Publication Data

US 2002/0016089 A1 Feb. 7, 2002

(30) Foreign Application Priority Data

May 11, 2000 (TW) ........................................ 89207906 U

(51) Int. Cl.[7] ............................................... H01R 12/00
(52) U.S. Cl. ........................... 439/55; 710/301; 710/305
(58) Field of Search ............................... 700/94; 439/55, 439/669, 668; 361/777; 174/250, 261, 267; 710/301, 305, 300

(56) References Cited

U.S. PATENT DOCUMENTS

| | | | | |
|---|---|---|---|---|
| 5,619,352 A | | 4/1997 | Koch et al. | 349/89 |
| 5,634,822 A | * | 6/1997 | Gunnell | 439/668 |
| 5,909,359 A | * | 6/1999 | Summers et al. | 361/748 |
| 6,146,150 A | * | 11/2000 | Roberts | 439/55 |
| 6,438,637 B1 | * | 8/2002 | Chen | 439/55 |

\* cited by examiner

*Primary Examiner*—P. Austin Bradley
*Assistant Examiner*—Briggitte R Hammond
(74) *Attorney, Agent, or Firm*—Rabin & Berdo, P.C.

(57) ABSTRACT

A slot pinhole dual layout is made of multi-rows of pinholes to perform selective electro-connection between two different interfaces, including a first pinhole layout and a second pinhole layout. The first pinhole layout is formed by four rows of pinholes, including first and second pinhole rows. The second pinhole layout is formed by another four rows of pinholes, including third and fourth pinhole rows. While the third and the fourth pinhole rows are shifted a proper distance, the first and the second pinhole rows would be interlaced, which enables the present invention to increase the compatibility between diverse extension slots.

19 Claims, 7 Drawing Sheets

SLOT PINHOLE DUAL LAYOUT ON A CIRCUIT BOARD

CROSS-REFERENCE TO RELATED APPLICATION

This application claims the priority benefit of Taiwan application serial no. 89207906, filed on May 11, 2000.

BACKGROUND OF THE INVENTION

1. Field of the Invention

The present invention relates to a layout of slot pinholes on a circuit board. More particularly, the present invention relates to a slot pinhole dual layout on a Printed Circuit Board (PCB) capable of mounting two kinds of different interface slots.

2. Description of Related Art

An ISA (Industrial Standard Architecture) slot is one kind of slot specification and has been used for years in personal computers. However, due to the fact that the access speed through an ISA interface is quite slow, it is becoming less common. Instead, PCI (Peripheral Component Interconnect) slots and other kinds of interface card slots are more popular. Since the overwhelming development of communication and multimedia products, a renovated CNR (Communication and Networking Riser) interface supporting functions such as audio, modem and LAN (Local Area Network) is gradually becoming indispensable. Though the quantity of PCI slots user requests is uncertain, the using of PCI slots still exists as a necessity in conventional extended equipment, which requires that the vendors of motherboards do a lot of research and development on manufacturing numerous different extension slots.

In other words, the quantity of extension slots used by consumers is not always the same; thus, the vendors of motherboards have to provide the motherboards with both PCI and CNR slots. Therefore, the vendors must develop at least two different products during research and store at least two different products in their stock. Hence, the amount of time consumed and the costs incurred during the research and development and the management of stored materials causes a lot of inconvenience.

FIG. 1 illustrates a portion of a commonly seen motherboard layout for extension slots in the present-day industry, wherein the motherboard 100 includes a six PCI slot pinhole layout 10a~10f and one CNR slot pinhole layout 12a. FIG. 2 illustrates a portion of the motherboard layout with a five PCI slot pinhole layout 10a~10e and a two CNR slot pinhole layout 12a, 12b. In order to meet market demands, the conventional method of manufacturing motherboards is to design two sets of motherboards with different quantities of PCI and CNR slots; since the proportion of motherboards using CNR slots is gradually increasing, the conventional design replaces the PCI slot 10f (and changes the placement of pinholes and circuits) with the CNR slots 12b as illustrated in FIG. 2. Therefore, there must be at least two lines of motherboard production for two different circuit placements.

From the above description, the disadvantages of slot pinhole layout on traditional circuit boards are listed as following:

1. Since the quantity and variety of slots on main boards is fixed, if the user needs to use at least two CNR slots, one must reconsider updating the motherboard, thus causing slow selling of the single CNR slot motherboards and increasing of the cost of storage.

2. Since the cost and time spent on developing transitional products are too much, it may be difficult for the products to enter the market.

The best solution to fit diverse requests on the quantity of slots on motherboards is to place every kind of slot onto the motherboards, and to be guided by the market-demand. If the demand for CNR increases, a PCI slot should be directly changed into a CNR slot under the principle wherein no circuit modification is required. However, since the size of a motherboard is fixed, and considering the problems of fitting the interface cards onto slots with the computer chassis, the space for placement of slots on a motherboard is really limited. Therefore, it would be impossible to unrestrictedly extend the size of a motherboard. One solution is to have two different kinds of slot pinhole layout and non-interfering circuits co-function on the same slot pinhole positions. When PCI or CNR slots require placement, the required pinhole layout is chosen, and the problems incurred in the course of R&D or during storage would naturally improve.

SUMMARY OF THE INVENTION

Accordingly, one object of the present invention is to choose either PCI or CNR slots based on market demands by having two different pinhole layouts co-functions at the same slot positions.

In order to achieve these and other objectives, a slot pinhole layout is provided according to a first preferred embodiment of the present invention. A first and second pinhole layout are included, wherein the first pinhole layout is formed of 4 pinhole rows including the first and the second pinhole rows. The second layout is formed of 4 pinhole rows, and therein includes the third and the fourth pinhole rows. The third and the fourth pinhole rows included in the second pinhole layout are moved a suitable distance and are staggered with the first and the second pinhole rows that are included in the first pinhole layout, and are placed on the same slot positions of the motherboard. The slot device can be chosen according to the market demand, and thus, can accelerate the development of diverse products, and increase product compatibility on the motherboard (including those in the mainstream and the transitional products) to lower the cost of stock as well as to promote the competitiveness of products.

For the reason of being better understood in the above description, objects, features and advantages of the present invention, a preferred embodiment will be provided in the following text and accompanying drawings will have a detailed description as well:

DESCRIPTION OF THE PREFERRED EMBODIMENTS

Figure 1:
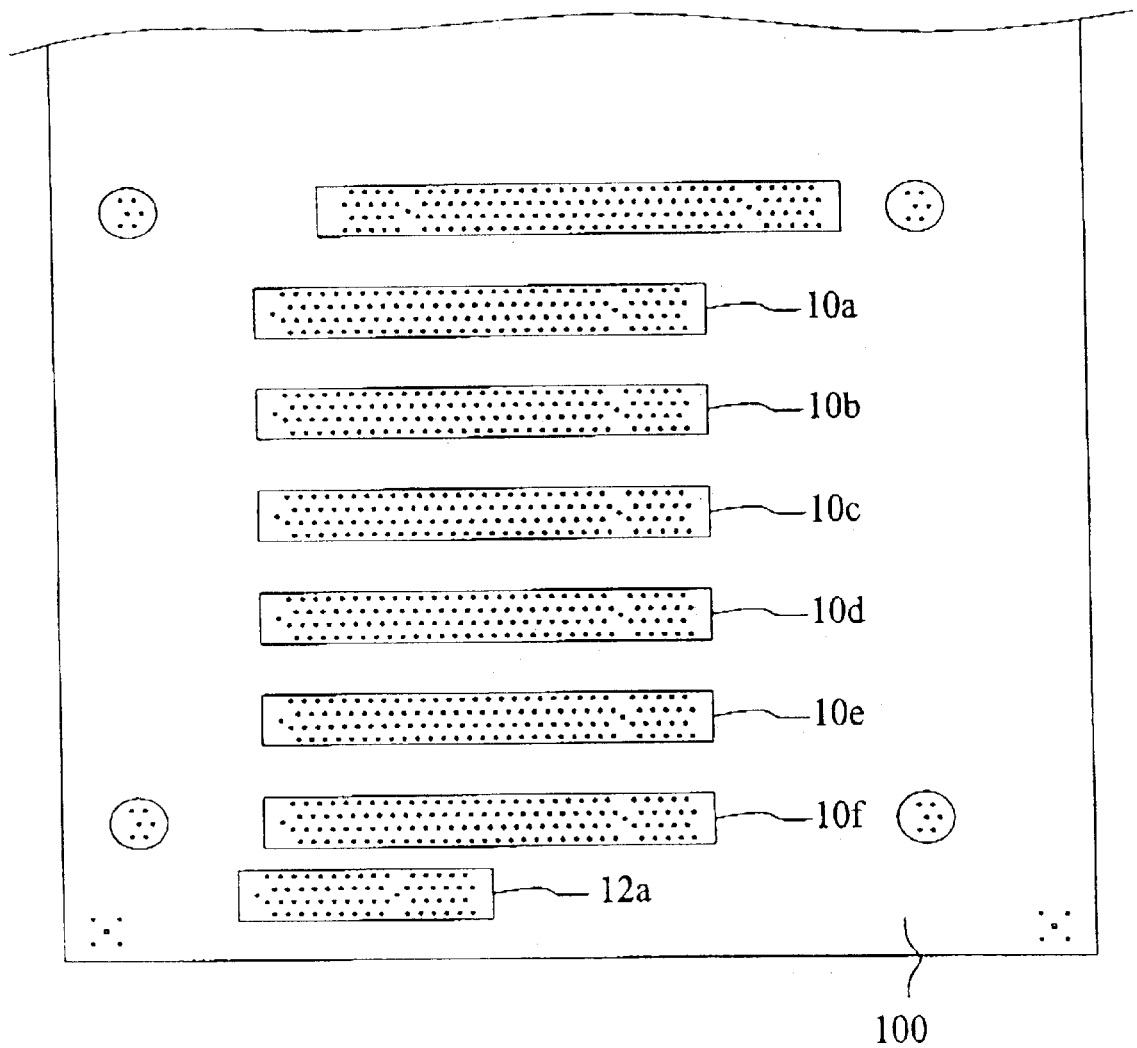
FIG. 1 illustrates a conventional motherboard layout with extension slot pinholes.
Figure 2:
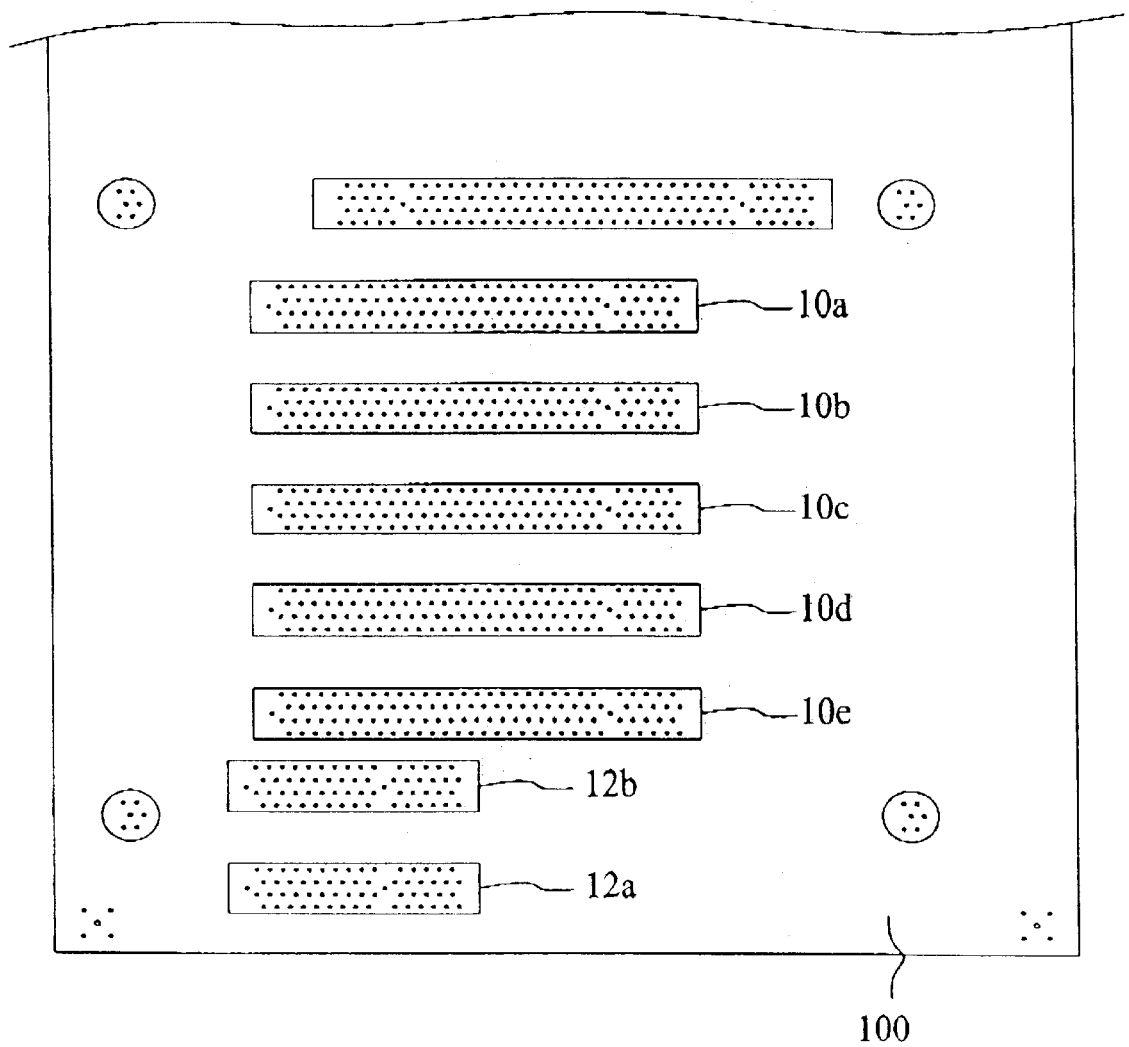
FIG. 2 illustrates another conventional layout of a motherboard with extension slot pinholes.
Figure 3:
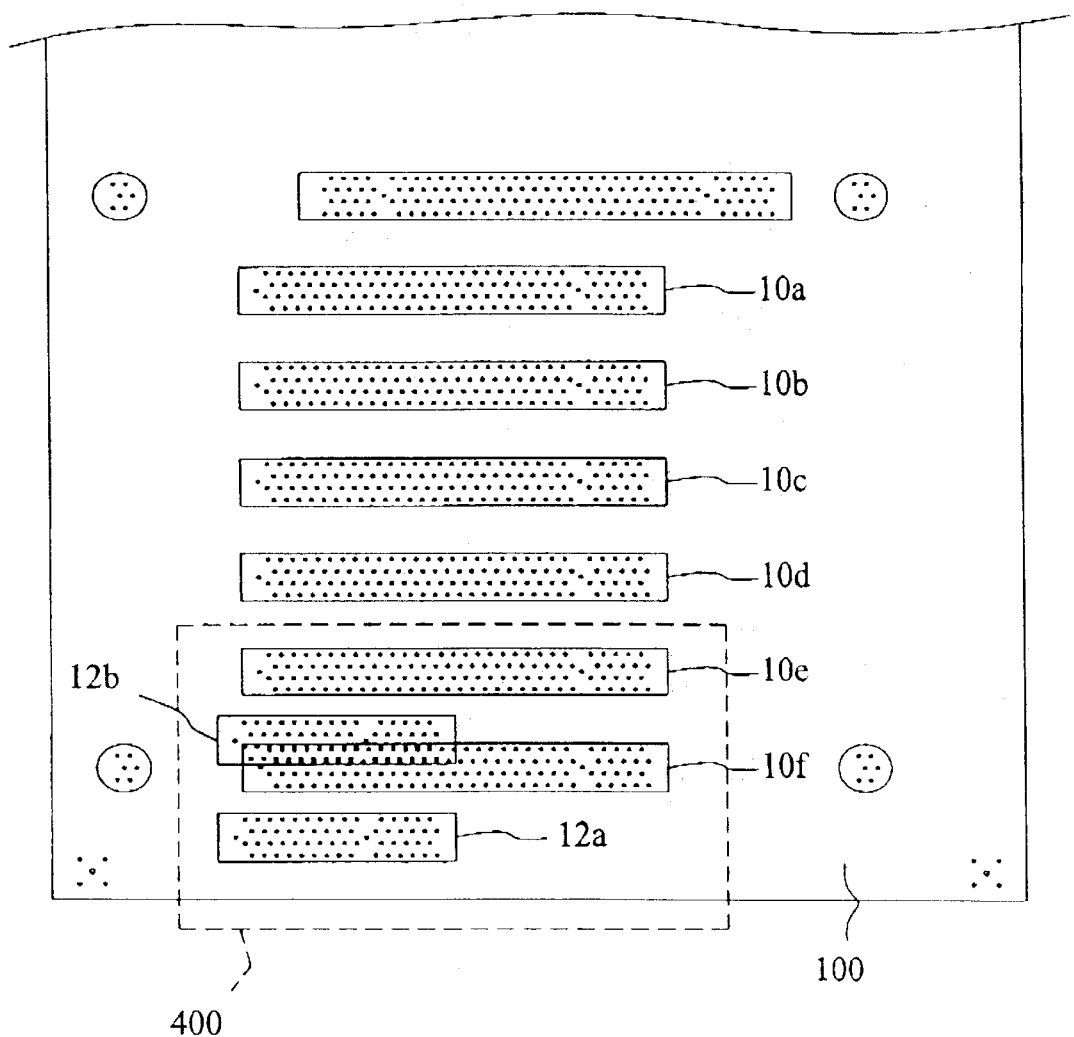
FIG. 3 illustrates the conventional conflicts that incur from adopting a slot pinhole dual layout motherboard with extension.

Referring to the FIG. 3, the motherboard 100 includes a six PCI slot pinhole layout 10a~10f and a two CNR slot pinhole layout 12a and 12b. However, since the size of the motherboard is fixed and also in light of the corresponding problems between the interface cards on the slots and motherboards, the positioning of slot placement is limited. Since there are only 7 slots available for placement (excluding the AGP slot), therefore, the number of slots used on the motherboard cannot be extended limitlessly. When forcing the PCI slot pinhole layout 10f and the CNR slot pinhole layout 12b to co-function in the same slot position, an electrical shortage would thus result due to the overlap and connection between pinholes.

Figure 4:
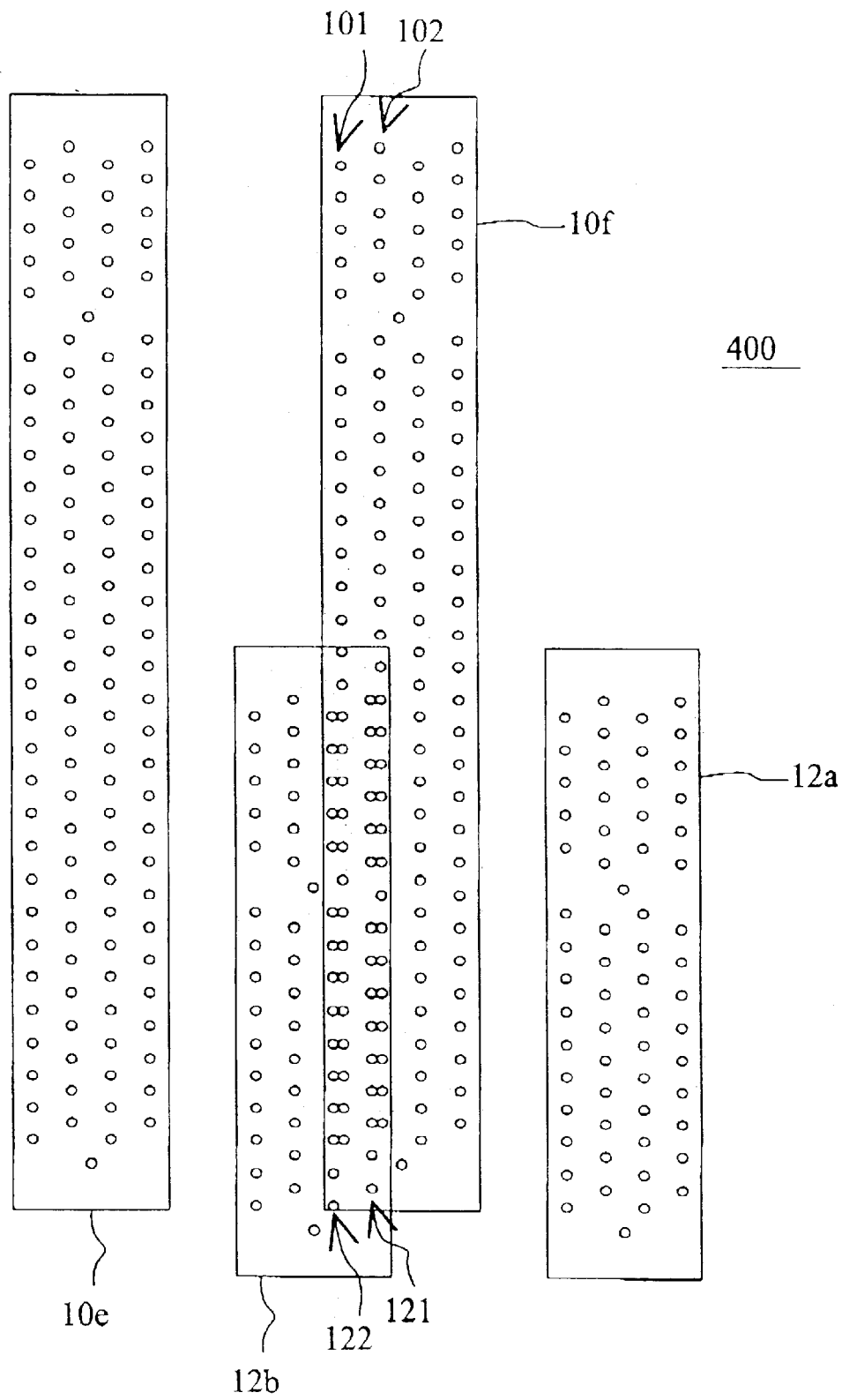
FIG. 4 is a magnified view of a portioned area illustrating the conflicts caused by adopting a motherboard layout with extension slot pinholes.

FIG. 4 is a magnified view illustrating a portion 400 of motherboard 100, from which we can see the conflicts or connections between the pinhole rows 121, 122 of CNR slot pinhole layout 12b and the pinhole rows 101, 102 of PCI slot pinhole layout 10f. Hence, circuit boards having different slots are unable to co-function, and accordingly, diverse products corresponding to different extension slots are produced.

Figure 5:
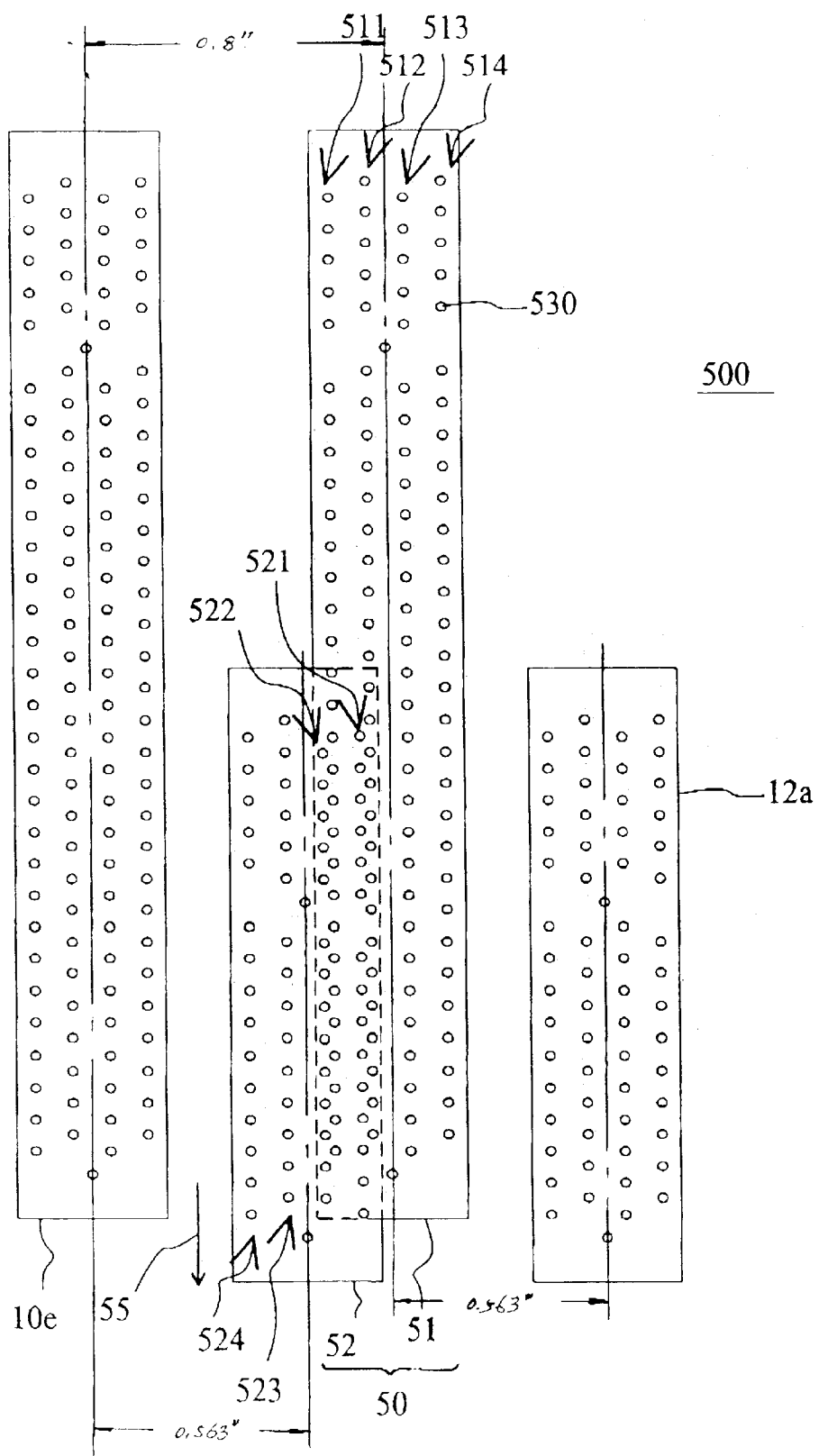
FIG. 5 illustrates the slot pinhole dual layout in a first preferred embodiment according to the present invention.

FIG. 5 illustrates the slot pinhole dual layout according to a first preferred embodiment in present invention. In the present invention, a dual pinhole layout 50 for slots is located at a portion 500 of a circuit board 100, and includes a first pinhole layout 51 and a second pinhole layout 52. There is another pinhole layout 12a beside the first pinhole layout 51 that continues to use the same slot on the slot pinhole layout 52, and can be used by the ever-present CNR slots. Moreover, there is yet another pinhole layout 10e beside the second pinhole layout 52 that continues to use the second pinhole layout on the same slot of the first pinhole layout 51, and can be used by the PCI slots.

In order for the first pinhole layout 51, the second pinhole layout 52, and two pinhole layouts 10e and 12a to co-function in the limited space of the circuit board, the first pinhole layout 51 and the second pinhole layout 52 are closely aligned together so that the dual layout 50 are on a single slot. Thus, depending on what is required, the user can easily select either the PCI or CNR slot on the slot pinhole dual layout 50.

The first pinhole layout 51 includes the pinhole rows 511, 512, 513, 514; the second pinhole layout 52 includes the pinhole rows 521, 522, 523, 524. Each pinhole row is made up of a plurality of pinholes 530, the pinhole rows 511, 512 on the first pinhole layout 51 and the pinhole rows 521, 522 on the second pinhole layout 52 can be aligned closely together without an overlap or connection between the pinholes 530. Therefore, the pinhole rows 521, 522 on the second pinhole layout 52 are moved an appropriate distance, such as moving downward 55, thereby widening the distance between the pinhole rows 511 and pinhole rows 512 on the first pinhole layout 51. This also means that a certain distance is kept between the pinholes 530 of the pinhole rows 511, 512 on the first pinholes layout 51 and those of pinhole rows 521, 522 on the second pinhole layout 52m, and are staggered orderly without causing overlap or connection between the pinholes 530.

When assembling the motherboard, as the use of CNR slots gradually increases as per the market demand, different PCBs would not need to be produced when applying the preferred embodiment of the present invention. Rather, only custom-made slots need alterations, wherein the CNR slots are electrically connected to the second pinhole layout 52 of the slot pinhole dual layout 50 in the present invention. As the market demand for PCI slots gradually increases, the PCI slots merely need to be electrically connected to the first pinhole layout 51 of the slot pinhole dual layout 50 in the present invention without having to produce custom-made motherboards. Even though custom-made pin header slots must be used when using the CNR slots, the required settings of the custom-made pin-headers and a new connector model slot for changing the pinhole position can be made to fit the pinhole layout. However, the production cost spent on the custom-made pin header slot and slot pinhole is much cheaper than that of producing two different circuit boards. Therefore, in application, the present invention can greatly reduce production costs.

In the present embodiment, since the number of pinholes on any of the pinhole rows on the second pinhole layout 52 is less than that of the first pinhole layout 51, the pinhole rows 521, 522 are moved onto the second pinhole layout to an appropriate distance, such as moving upward 55. The pinhole rows 511, 512 on the first pinhole layout 51 can also be moved in order to achieve the same result.

Figure 6:
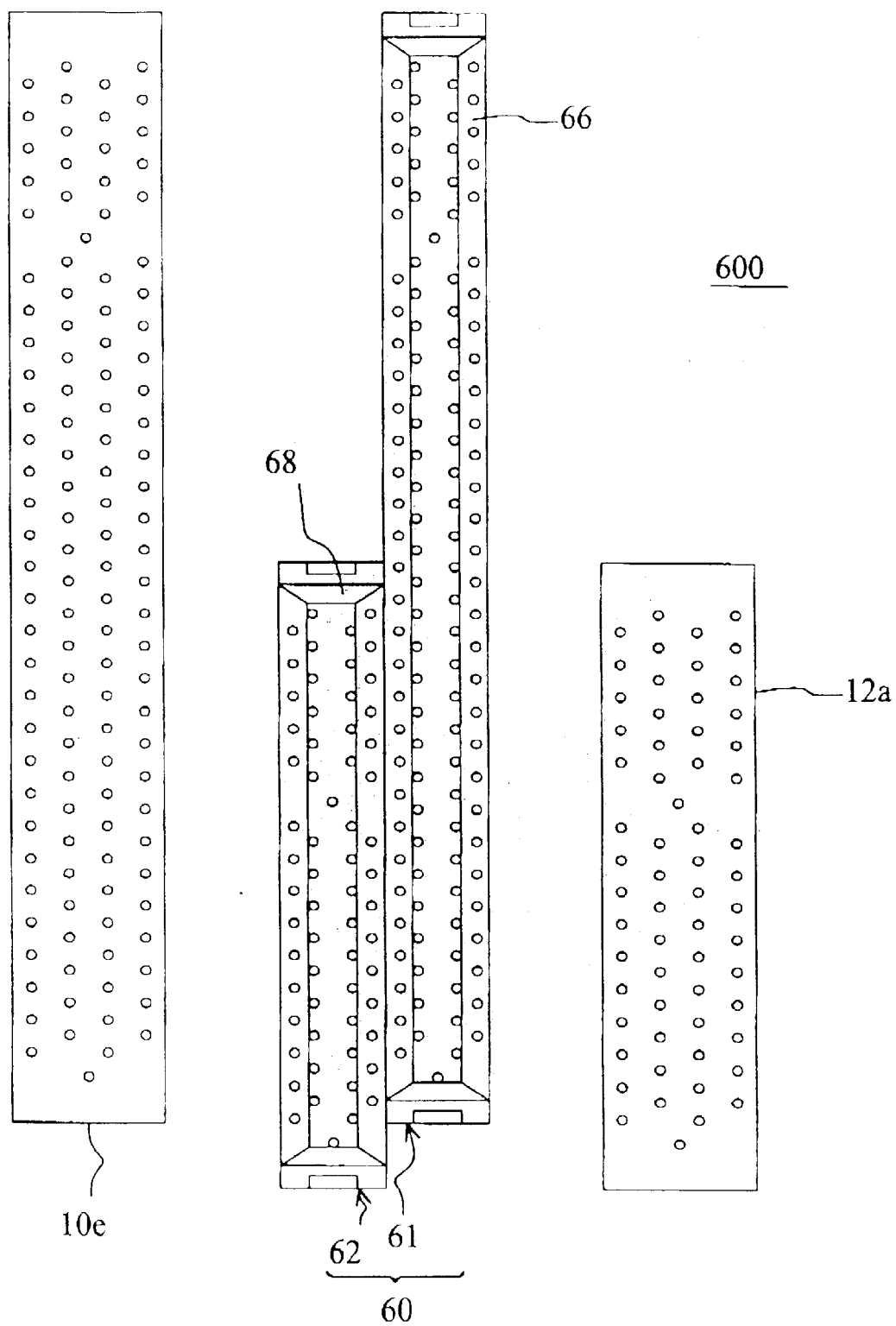
FIG. 6 illustrates the slot pinhole dual layout in a second preferred embodiment according to the present invention.

FIG. 6 illustrates the slot pinhole dual layout in the second preferred embodiment according to the present invention. The slot pinhole dual layout 60 is located at a portion 600 of a motherboard or circuit board 100, and includes a first pinhole layout 61 and a second pinhole layout 62; the first pinhole layout 61 is made up of four pinhole rows and is suitable for continued use of the PCI slot 66, wherein each pinhole row is made up of a plurality of pinholes. The second pinhole layout 62 is also made up of four pinhole rows suitable for continued use of the CNR slot 68, wherein each pinhole row also contains a plurality of pinholes.

Next, the slot pinhole dual layout 60, merely needs to minimize the distance between the pinholes on the first pinhole layout 61 and those on the second pinhole layout 62. Thus, by keeping the first pinhole layout 61 and the second pinhole layout 62 close enough but not overlapped, over and above such advantages as the above-mentioned of continued use of the PCI slot 66 and the co-functioning of the CNR slot 68, it can also be easily color-coded, for example, the PCI slot 66 is white, and the CNR slot 68 is cyan.

Figure 7:
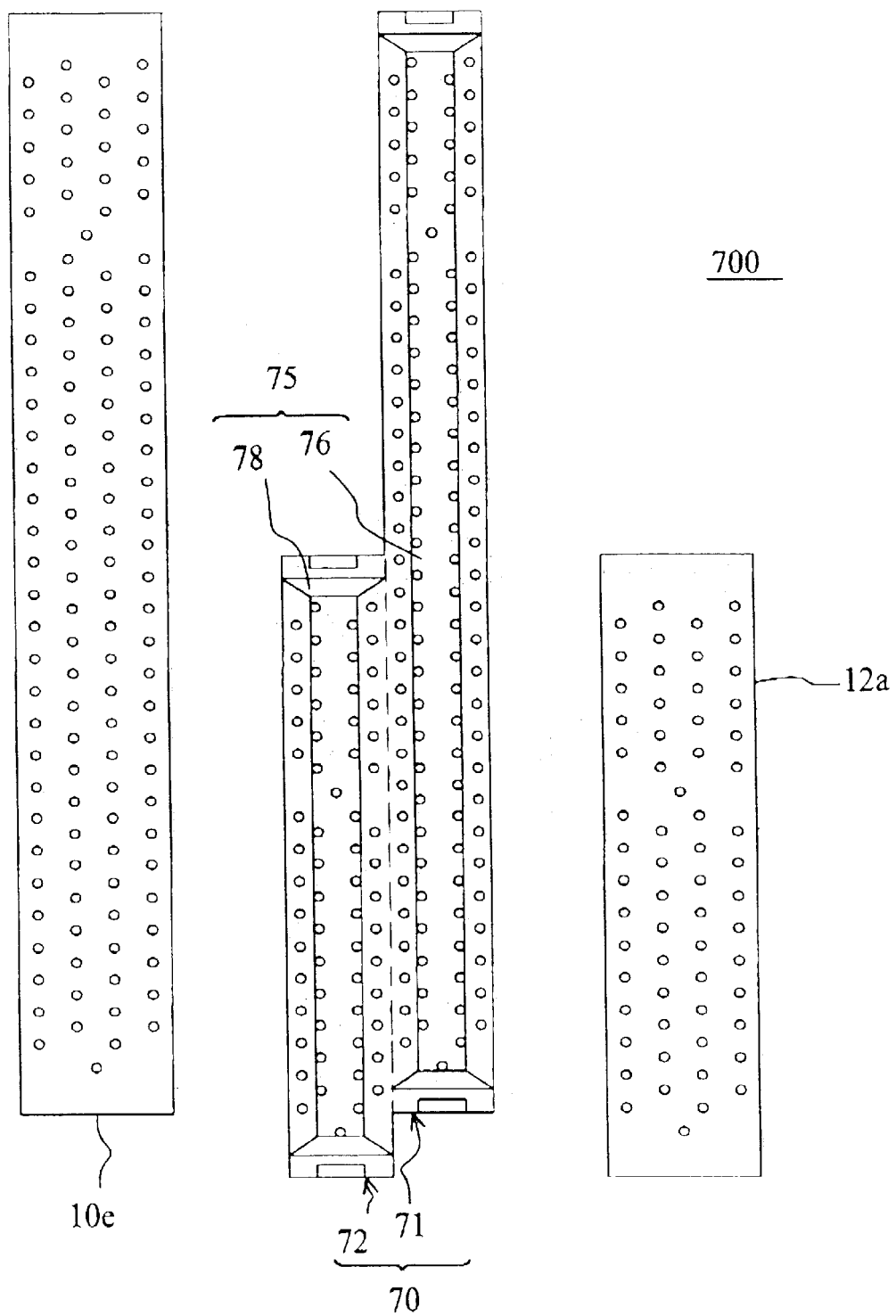
FIG. 7 illustrates the slot pinhole dual layout in a third preferred embodiment according to the present invention.

FIG. 7 illustrates the slot pinhole dual layout in the third preferred embodiment according to the present invention. The slot pinhole dual layout 70 is located at a portion 700 of a motherboard or circuit board 100 and the slot pinhole dual layout 70 includes a first pinhole layout 71 and a second pinhole layout 72. The first pinhole layout 71 is made up of 4 pinhole rows and is suitable for continued use of the PCI slot 76. Each pinhole row is made up of a plurality of pinholes; the second pinhole layout 72 also has 4 pinhole rows and is suitable for continued use of the PCI slot 78, wherein each pinhole row is formed of a plurality of pinholes. The distance between the pinhole rows of the first pinhole layout 71 and those of the second pinhole layout 72 can be minimized to an appropriate value so that the first pinhole layout 71 and the second pinhole layout 72 are close enough but do not overlap for continued use of the complex slot 75.

In addition, a complex slot 75 using both the PCI slot 76 and the CNR slot 78 has the advantages of choosing from the PCI slot and the CNR slot, simultaneously keeping two different slots.

Nowadays, in the market for motherboards, customer demands for quantity and a combination of diverse extension slots are different, and there are conflicts between PCI slots and CNR slots on the same slot layout. In order to satisfy the demands of different customers without spending too much time and money on producing two or more different products, so that every type of product can enter the market, it can be achieved by either moving the pin headers on the slots or making a new design. Moreover, it achieves the usage of the same slot, which can provide two different interfaces after having the dual design slot layout.

From the preferred embodiment described in the above, there are some advantages from applying the present invention, listed as following:

1. The dual layout in the present invention can solve the problems of the limited size of motherboard; and can also provide different slot styles to be chosen depending on market demand.
2. The dual layout in the present invention can solve the problems between different generations of interface devices, and also the customers' diverse demands on the mainstream product and the transitional products.
3. The application of the slot pinhole dual layout in the present invention can increase the usage of the same printing circuit board to facilitate the management of inventory stock and also serves to lower the cost of inventory stock.

The present invention has been disclosed using an exemplary preferred embodiment. However, it is to be understood that the scope and the sprit of the invention is not limited to the disclosed embodiments; on the contrary, it is intended to cover various modifications and similar arrangements. The scope of the claims, therefore, should be accorded the broadest interpretation so as to encompass all such modifications and similar arrangements.

What is claimed is:

1. A slot pinhole dual layout located on a printed circuit board and adapted to receive one of a first slot and a second slot, the slot pinhole dual layout comprising:
    a first pinhole layout including a plurality of pinhole rows, suitable for receiving the first slot, wherein each pinhole row has a plurality of pinholes, and the pinhole rows include at least a first pinhole row and a second pinhole row; and
    a second pinhole layout including a plurality of pinhole rows, suitable for receiving the second slot, wherein each pinhole row has a plurality of pinholes and the pinhole rows include at least a third pinhole row and a fourth pinhole row;
    wherein the first pinhole row and the second pinhole row, as well as segments of the third pinhole row and the fourth pinhole row, are located in a region where the first pinhole layout and the second pinhole layout overlap,
    wherein the segment of the third pinhole row is disposed adjacent to but spaced apart from one of the first and second pinhole rows, with the pinholes in the segment of the third row being staggered with respect to the pinholes of said one of the first and second rows, and
    wherein the segment of the fourth pinhole row is disposed adjacent to but spaced apart from the other of the first and second pinhole rows, with the pinholes in the segment of the fourth row being staggered with respect to the pinholes of said other of the first and second rows.

2. The slot pinhole dual layout as claimed in claim 1, wherein the first pinhole layout includes 4 rows of pinholes.

3. The slot pinhole dual layout as claimed in claim 1, wherein the second pinhole layout includes 4 rows of pinholes.

4. The slot pinhole dual layout as claimed in claim 1, wherein the first slot includes a PCI slot.

5. The slot pinhole dual layout as claimed in claim 1, wherein the second slot includes a CNR slot.

6. The slot pinhole dual layout as claimed in claim 1, wherein the printed circuit board is a motherboard.

7. The slot pinhole dual layout as claimed in claim 1, wherein the placement of a PCI slot corresponding to the first pinhole row and the second pinhole row is moved to a certain distance in order to separate it from the third pinhole row and the fourth pinhole row.

8. The slot pinhole dual layout as claimed in claim 1, wherein the placement of a CNR slot corresponding to the first pinhole row and the second pinhole row is moved to a certain distance in order to separate it from the third pinhole row and the fourth pinhole row.

9. The slot pinhole dual layout as claimed in claim 1, the second slot includes a CNR slot.

10. A slot pinhole dual layout located on a printed circuit board comprising:
    a first pinhole layout including a plurality of pinhole rows, suitable for receiving a first slot, wherein each pinhole row has a plurality of pinholes; and
    a second pinhole layout including a plurality of pinhole rows, suitable for receiving a second slot, wherein each pinhole row has a plurality of pinholes;
    wherein a distance between the pinhole rows of the first pinhole layout and the second pinhole layout is minimized, so that the first pinhole layout and the second pinhole layout do not overlap but are kept close enough for the slot pinhole dual layout to receive one of the first slot and the second slot, but not both slots.

11. The slot pinhole dual layout as claimed in claim 10, wherein the first pinhole layout includes at least 4 pinhole rows.

12. The slot pinhole dual layout as claimed in claim 10, wherein the second pinhole layout includes at least 4 pinhole rows.

13. The slot pinhole dual layout as claimed in claim 10, wherein the first slot includes a PCI slot.

14. The slot pinhole dual layout as claimed in claim 10, wherein the printed circuit board is a motherboard.

15. A slot pinhole dual layout as claimed in claim 10, wherein the pinhole rows of the first pinhole layout comprise first, second, third, and fourth pinhole rows in sequence, wherein the pinhole rows of the second pinhole layout comprise fifth, sixth, seventh, and eighth pinhole rows in sequence, and wherein the third and sixth pinhole rows are disposed a predetermined distance apart, the predetermined distance being smaller than the distance between the first and fourth pinhole rows and also smaller than the distance between the fifth and eighth pinhole rows.

16. A slot pinhole dual layout located on a printed circuit board, comprising:
    a first slot layout including a plurality of pinhole rows, and each pinhole row having a plurality of pinholes; and
    a second slot layout including a plurality of pinhole rows, and each pinhole row having a plurality of pinholes,
    wherein the slot pinhole dual layout is adapted to receive a complex slot including a PCI slot and a CNR slot,
    wherein the first lot layout has first, second, third, and fourth pinhole rows that are sequentially disposed in a first region,
    wherein the second slot layout has fifth, sixth, seventh, and eighth pinhole rows that are disposed in a second region adjacent the first region, and wherein the third and sixth pinhole rows are disposed a predetermined distance apart, the predetermined distance being smaller than the distance between the first and fourth pinhole rows and also smaller than the distance between the fifth and eighth pinhole rows.

17. The slot pinhole dual layout as claimed in claims 16, wherein the rows of the first slot layout are staggered.

18. The slot pinhole dual layout as claimed in claim 16, wherein the rows of the second slot layout are staggered.

19. The slot pinhole dual layout as claimed in claim 16, wherein the printed circuit board is a motherboard.

* * * * *